(12) United States Patent
Masumoto et al.

(10) Patent No.: US 12,117,495 B2
(45) Date of Patent: Oct. 15, 2024

(54) ESTIMATION DEVICE

(71) Applicant: TOYOTA JIDOSHA KABUSHIKI KAISHA, Toyota (JP)

(72) Inventors: Miki Masumoto, Toyota (JP); Yuya Ando, Toyota (JP); Yuji Nishi, Toyota (JP); Mai Fujiwara, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 158 days.

(21) Appl. No.: 17/937,610

(22) Filed: Oct. 3, 2022

(65) Prior Publication Data

US 2023/0131177 A1 Apr. 27, 2023

(30) Foreign Application Priority Data

Oct. 27, 2021 (JP) .................................. 2021-175289

(51) Int. Cl.
| | | |
|---|---|---|
| *G01R 31/3835* | (2019.01) | |
| *B60L 58/12* | (2019.01) | |
| *B60L 58/24* | (2019.01) | |
| *G01R 31/367* | (2019.01) | |
| *G01R 31/396* | (2019.01) | |
| *H01M 10/42* | (2006.01) | |

(Continued)

(52) U.S. Cl.
CPC ....... *G01R 31/3835* (2019.01); *G01R 31/367* (2019.01); *G01R 31/396* (2019.01); *H01M 10/4257* (2013.01); *H01M 10/465* (2013.01); *H01M 10/486* (2013.01); *B60L 58/12* (2019.02); *B60L 58/24* (2019.02); *H01M 2010/4271* (2013.01); *H01M 2010/4278* (2013.01); *H01M 2220/20* (2013.01)

(58) Field of Classification Search
CPC ......................... G01R 31/3835; G01R 31/396; G01R 31/367; H01M 10/4257; H01M 10/465; H01M 10/486; H01M 2010/4271; H01M 2010/4278; H01M 2220/20; B60L 58/12; B60L 58/24
See application file for complete search history.

(56) References Cited

U.S. PATENT DOCUMENTS

| | | | | |
|---|---|---|---|---|
| 2008/0258895 A1* | 10/2008 | Yamaguchi | .......... | G07C 5/0816 340/455 |
| 2015/0369869 A1 | 12/2015 | Tsuzuku et al. | | |
| 2019/0070967 A1* | 3/2019 | Ishigaki | .................. | B60L 58/12 |

FOREIGN PATENT DOCUMENTS

| | | |
|---|---|---|
| JP | 2006-080002 A | 3/2006 |
| JP | 2011-229275 A | 11/2011 |

(Continued)

*Primary Examiner* — Stephanie E Bloss
*Assistant Examiner* — Michael A Harrison
(74) *Attorney, Agent, or Firm* — Finnegan, Henderson, Farabow, Garrett and Dunner, LLP

(57) ABSTRACT

An estimation device configured to estimate a charge rate of a battery includes a voltage sensor configured to detect a voltage of the battery, a temperature sensor configured to detect a temperature of the battery, and a processing circuit. The processing circuit is connected to the voltage sensor and the temperature sensor and is configured to execute, while a vehicle is parked, an estimation process of estimating the charge rate of the battery based on a detection voltage and a detection temperature. The detection voltage is detected by the voltage sensor. The detection temperature is detected by the temperature sensor.

9 Claims, 8 Drawing Sheets

(51) Int. Cl.
*H01M 10/46* (2006.01)
*H01M 10/48* (2006.01)

(56) References Cited

FOREIGN PATENT DOCUMENTS

| | | |
|---|---|---|
| JP | 2014-163861 A | 9/2014 |
| JP | 2014-176251 A | 9/2014 |
| JP | 2019-120647 A | 7/2019 |
| JP | 2020-112415 A | 7/2020 |
| JP | 2021-021658 A | 2/2021 |
| WO | WO 2020/059843 A1 | 3/2020 |

* cited by examiner

ESTIMATION DEVICE

CROSS-REFERENCE TO RELATED APPLICATION

This application claims priority to Japanese Patent Application No. 2021-175289 filed on Oct. 27, 2021, incorporated herein by reference in its entirety.

BACKGROUND

1. Technical Field

The present disclosure relates to an estimation device configured to estimate a charge rate of a battery.

2. Description of Related Art

Japanese Unexamined Patent Application Publication No. 2014-163861 (JP 2014-163861 A) describes an estimation device that estimates a charge rate of a battery. The estimation device includes a voltage sensor that detects a voltage of the battery and a processing circuit connected to the voltage sensor. The processing circuit creates a data group representing a relationship between a voltage at a time of charging and discharging (that is, closed circuit voltage) and the charge rate and estimates the charge rate of the battery based on the data group and the detection voltage detected by the voltage sensor. With such a configuration, it is possible to accurately estimate the charge rate of the battery during the charging and discharging of the battery.

SUMMARY

It is known that the relationship between the battery voltage and the charge rate (for example, state of charge (SOC)) changes according to a charge and discharge current of the battery and a temperature of the battery. Therefore, in order to estimate the charge rate of the battery in the estimation device as described above, a large number of data groups representing the relationship between the voltage and the charge rate for various charge and discharge currents and a large number of data groups representing the relationship between the voltage and the charge rate for various temperatures are requested. In view of such circumstances, the present specification provides a technique for estimating a charge rate of a battery with a simple configuration.

Aspects of the present disclosure relate to an estimation device configured to estimate a charge rate of a battery. The battery is configured to supply electric power to an auxiliary mounted on a vehicle. The estimation device includes a voltage sensor configured to detect a voltage of the battery, a temperature sensor configured to detect a temperature of the battery, and a processing circuit connected to the voltage sensor and the temperature sensor and configured to execute, while the vehicle is parked, an estimation process of estimating the charge rate of the battery based on a detection voltage and a detection temperature. The detection voltage is detected by the voltage sensor. The detection temperature is detected by the temperature sensor.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

Figure 1:
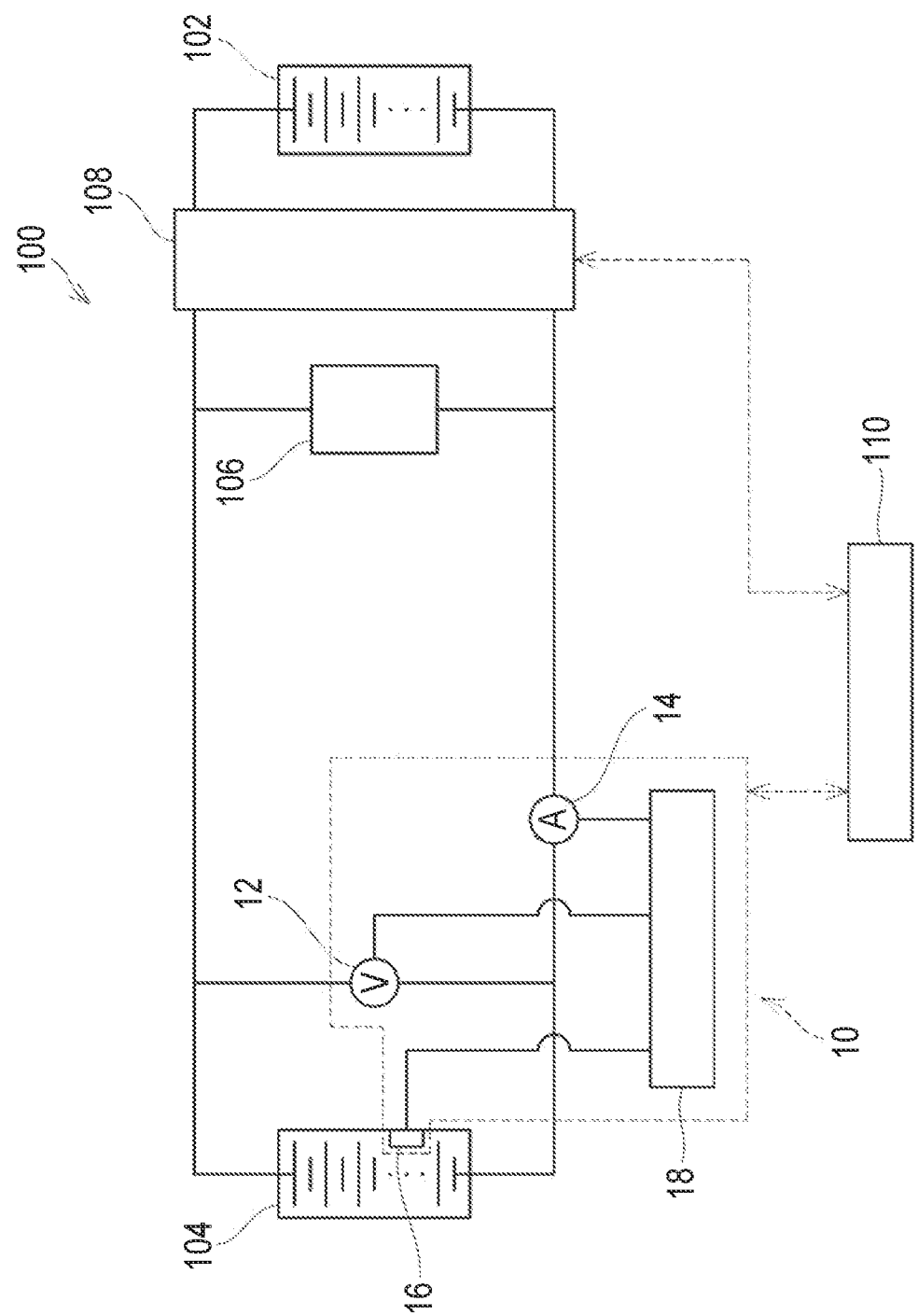
FIG. 1 is a schematic diagram showing a configuration of a vehicle and an estimation device.

In aspects of the present disclosure, an estimation process may be a process of deciding a relationship between a detection voltage and a charge rate according to a detection temperature and estimating the charge rate using the decided relationship and the detection voltage. With such a configuration, it is possible to accurately estimate the charge rate of a battery based on both the detection voltage and the detection temperature of the battery. In this case, the processing circuit may store in advance a relational equation, map, or table that describes the relationship between the detection voltage and the charge rate in association with various temperatures.

In the aspects of the present disclosure, the processing circuit may be configured to stop the estimation process when charging of the battery is started while a vehicle is parked. Even while the vehicle is parked, the detection voltage by the voltage sensor depends on a charge voltage applied to the battery while the battery is charged. For this reason, when the charging of the battery is started while the vehicle is parked, the above estimation process is considered to be stopped. Accordingly, it is possible to avoid erroneously estimating the battery charge rate while the battery is charged.

In the aspects of the present disclosure, the processing circuit may be configured to restart the estimation process when the charging of the battery ends and then a predetermined condition is satisfied. Even immediately after the charging of the battery ends, an influence of the charging remains temporarily on a voltage output by the battery. During that time, the detection voltage by the voltage sensor does not necessarily correspond to the battery charge rate. For this reason, even after the charging of the battery ends, the above estimation process is considered to be stopped until a condition that the influence of the charging may be determined to be substantially eliminated is satisfied. Accordingly, it is possible to avoid erroneously estimating the battery charge rate immediately after the charging of the battery ends.

In the aspects of the present disclosure, the predetermined condition includes a condition where a discharge amount discharged from the battery after the charging reaches a charge amount charged to the battery during the charging. That is, the estimation process may be restarted when the battery charge rate after the charging reaches a battery charge rate at a start point in time of the charging. Immediately after the charging of the battery ends, the influence of the charging remains temporarily inside the battery. During that time, the detection voltage by the voltage sensor does not necessarily correspond to the battery charge rate. For this reason, even after the charging of the battery ends, the above estimation process is considered to be stopped until the battery charge rate returns to a charge rate before the charging. Accordingly, it is possible to avoid erroneously estimating the battery charge rate immediately after the charging of the battery ends.

In the aspects of the present disclosure, the processing circuit may be configured to store a detection voltage and a detection temperature at the start point in time of the charging. In this case, the predetermined condition includes a condition where the charge rate estimated from the detection voltage and the detection temperature after the end of the charging is lowered to the charge rate estimated from the detection voltage and the detection temperature at the start point in time of the charging. With such a configuration, even when the battery temperature at the start point in time of the charging is different from the battery temperature after the end of the charging, it is possible to correctly specify a timing at which the battery charge rate after the end of the charging is equal to the charge rate at the start point in time of the charging. Accordingly, it is possible to stop the above estimation process until the battery charge rate returns to the charge rate before the charging and thus avoid erroneously estimating the battery charge rate.

In the aspects of the present disclosure, the processing circuit may be configured to estimate, while the estimation process is stopped, the charge rate of the battery based on the charge rate at the start point in time of the charging, the charge amount charged to the battery during the charging, and the discharge amount discharged from the battery after the charging. That is, the battery charge rate may be estimated by using a method different from the above estimation process during the charging of the battery and in a period immediately after the charging of the battery. With such a configuration, it is possible to estimate the battery charge rate even during the charging of the battery and in the period immediately after the charging of the battery.

In the aspects of the present disclosure, the processing circuit may be configured to estimate, while the estimation process is stopped, the charge rate of the battery based on the charge rate at the start point in time of the charging, the charge amount charged to the battery during the charging, and the battery discharge amount estimated from an elapsed time after the charging. With such a configuration, it is also possible to estimate the battery charge rate even during the charging of the battery and in the period immediately after the charging of the battery.

In the aspects of the present disclosure, in the charging of the battery, the charge current to the battery may be further limited as the detection temperature of the battery is lower. With such a configuration, it is possible to suppress or substantially eliminate the influence of the battery charging on the battery. Accordingly, it is possible to accurately estimate the battery charge rate even after the charging of the battery.

In the aspects of the present disclosure, the charging of the battery may be performed by a solar charging system mounted on the vehicle. With such a configuration, it is possible to substantially ignore an influence of the charge current on the battery since a charge current of the battery when the vehicle is parked is sufficiently small.

In the aspects of the present disclosure, the charging of the battery may be performed by an external power supply connected to the vehicle. Even with such a configuration, it is possible to substantially ignore the influence of the charge current on the battery when a charge current supplied to the battery is sufficiently small.

With the estimation device of the aspects of the present disclosure, the estimation process of estimating the battery charge rate is executed while the vehicle is parked. In the battery that supplies electric power to an auxiliary of the vehicle, a discharge current when the vehicle is parked (so-called dark current) is sufficiently smaller than a discharge current when the vehicle travels. Therefore, it is possible to ignore an influence of such a discharge current on the battery voltage. On the other hand, even when the vehicle is parked, the battery temperature changes variously due to influences of the air temperature and the like. Therefore, it is not possible to ignore the influence of such a temperature change on the battery voltage. For this reason, in the above estimation process, the battery charge rate is estimated based on the voltage and temperature of the battery. As described above, a timing of estimating the battery charge rate is limited to the time when the vehicle is parked, and the battery temperature is still taken into consideration. With the above, it is possible to accurately estimate the battery charge rate with a simple configuration.

An estimation device 10 of an embodiment and a vehicle 100 employing the estimation device will be described with reference to the drawings. The vehicle 100 referred to here is a so-called automobile, which is a vehicle traveling on a road surface. The road surface is not limited to a so-called public road. The road surface is also intended to be a private land or an indoor floor surface on which the vehicle 100 can travel. A technique described in the present embodiment can be effectively employed not only for the vehicle traveling on the road surface but also for a vehicle traveling on a track. Further, the technique disclosed in the present embodiment is not limited to the vehicle 100 and may be employed for moving objects, such as a ship and an aircraft.

As shown in FIG. 1, the vehicle 100 includes a main battery 102, an auxiliary battery 104, and an auxiliary 106.

The main battery 102 is a battery that supplies the electric power to a motor for traveling of the vehicle 100 (not shown) or the like. The auxiliary battery 104 is a battery that supplies the electric power to the auxiliary 106 mounted on the vehicle 100. The auxiliary 106 is, for example, a room lamp or a car navigation device. The auxiliary battery 104 is electrically connected to the auxiliary 106 and can supply the electric power to the auxiliary 106. The auxiliary 106 can be operated by the electric power supplied from the auxiliary battery 104. A rated voltage of the auxiliary battery 104 is lower than a rated voltage of the main battery 102. As an example, the rated voltage of the auxiliary battery 104 is 12 V, and the rated voltage of the main battery 102 is 200 V to 600 V.

Each of the main battery 102 and the auxiliary battery 104 is a secondary battery in which a plurality of battery cells are connected in series. A specific number of the battery cells included in each of the main battery 102 and the auxiliary battery 104 is not particularly limited and may be at least one. Each of the battery cells is, for example, a lithium ion battery. However, each of the battery cells does not necessarily have to be the lithium ion battery and may be another battery, such as a nickel hydrogen battery.

As shown in FIG. 1, the vehicle 100 further includes a DC-DC converter 108 and a control device 110. The DC-DC converter 108 is a device that steps up or steps down input direct current electric power and outputs the stepped-up or stepped-down electric power. The control device 110 is a device that monitors and controls the operation of the vehicle 100. The DC-DC converter 108 is provided between the main battery 102 and the auxiliary battery 104. The converter steps down the direct current electric power from the main battery 102 and supplies the stepped-down electric power to an auxiliary battery 104 side (for example, the auxiliary battery 104 and the auxiliary 106). The DC-DC converter 108 is configured to be communicable with the control device 110, and the operation of the DC-DC converter 108 is controlled by the control device 110. Therefore, the control device 110 can perform the charging of the auxiliary battery 104 with the main battery 102 by controlling the operation of the DC-DC converter 108.

Next, the estimation device 10 will be described. The estimation device 10 is a device that estimates the charge rate of the auxiliary battery 104. As shown in FIG. 1, the estimation device 10 includes a voltage sensor 12, a current sensor 14, a temperature sensor 16, and a processing circuit 18. The voltage sensor 12 is electrically connected to both ends of the auxiliary battery 104 and can detect a voltage of the auxiliary battery 104. The current sensor 14 is connected in series with the auxiliary battery 104 and can detect a current of the auxiliary battery 104. The temperature sensor 16 is disposed, for example, inside a case in which the auxiliary battery 104 is housed and can detect a temperature of the auxiliary battery 104. The processing circuit 18 is communicably connected to the sensors 12, 14, and 16 and can monitor the voltage, current, and temperature of the auxiliary battery 104 detected by the sensors 12, 14, and 16. As will be described in detail below, the processing circuit 18 is configured to be able to execute a series of processes including the estimation process of estimating the charge rate of the auxiliary battery 104.

The processing circuit 18 is also communicably connected to the control device 110. The processing circuit can transmit information on a state of the auxiliary battery 104 to the control device 110 and receive information on a state of the vehicle 100 from the control device 110. As an example, the processing circuit 18 can transmit the charge rate of the auxiliary battery 104 to the control device 110. Further, although not particularly limited, when the vehicle 100 is driven or parked by a user, the control device 110 can transmit a notification corresponding to the driving or stop (for example, a driving start notification or a parking start notification) to the processing circuit 18. The term stating that the vehicle 100 is parked means a state where the vehicle 100 is continuously parked and includes, for example, a state where a main switch of the vehicle 100 is turned off. Therefore, the control device 110 transmits the parking start notification to the processing circuit 18 when the main switch of the vehicle 100 is turned off and transmits the driving start notification to the processing circuit 18 when the main switch of the vehicle 100 is turned on. The main switch of the vehicle 100 may be referred to as an ignition switch, following the custom for an engine vehicle. The control device 110 can start and stop the charging of the auxiliary battery 104 with the main battery 102 by controlling the operation of the DC-DC converter 108 based on the charge rate of the auxiliary battery 104 received from the processing circuit 18, a parking time of the vehicle 100, or the like.

Next, the series of processes executed by the processing circuit 18 will be described with reference to FIGS. 2 to 6. In step S10 of FIG. 2, the processing circuit 18 determines whether or not the vehicle 100 is parked. As described above, when the vehicle 100 is parked, the control device 110 transmits the parking start notification to the processing circuit 18 of the estimation device 10. When the parking start notification is received (YES in step S10), the processing circuit 18 proceeds to a process of step S12. On the contrary, when NO is obtained in step S10, the processing circuit 18 ends the series of processes.

In step S12, the processing circuit 18 determines whether or not the charging of the auxiliary battery 104 is started. When the vehicle 100 is parked, the electric power is supplied from the auxiliary battery 104 to the auxiliary 106. Therefore, the charge rate of the auxiliary battery 104 decreases with time. However, as described above, the control device 110 is configured to charge the auxiliary battery 104 by the main battery 102 based on the charge rate of the auxiliary battery 104, the parking time of the vehicle 100, or the like. The processing circuit 18 can detect that the charging of the auxiliary battery 104 is started based on the detection values of the sensors 12, 14, and 16. As another embodiment, the control device 110 may be configured to notify, when the charging of the auxiliary battery 104 by the main battery 102 is started and stopped, the processing circuit 18 of the charging start and stop. In this case, the processing circuit 18 may determine whether or not the charging of the auxiliary battery 104 is started based on the notification from the control device 110. When NO is obtained in step S12, the processing circuit 18 proceeds to step S14. When YES is obtained in step S12, the processing circuit 18 proceeds to step S20 in FIG. 5 via X in FIG. 2.

In step S14, the processing circuit 18 acquires the detection voltage detected by the voltage sensor 12 and the detection temperature detected by the temperature sensor 16. While the auxiliary battery 104 is discharged, the detection voltage by the voltage sensor 12 matches the voltage of the auxiliary battery 104. Further, the detection temperature by the temperature sensor 16 matches the temperature of the auxiliary battery 104.

Figure 3:
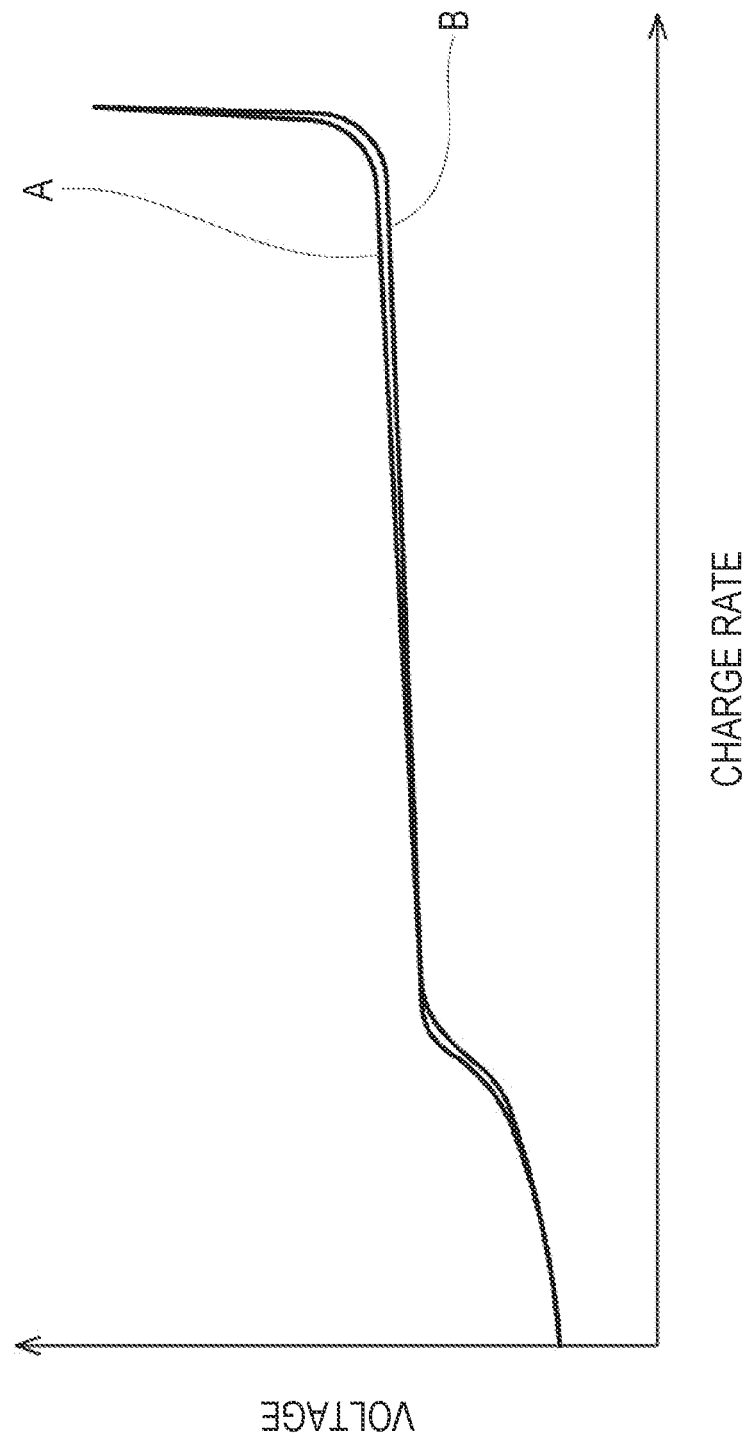
FIG. 3 is a graph showing an example of a relationship between a charge rate and a voltage of an auxiliary battery. Note that a graph A in FIG. 3 indicates a case where a discharge current of the auxiliary battery is a first current value, and a graph B in FIG. 3 indicates a case where the discharge current of the auxiliary battery is a second current value. The first current value is smaller than the second current value.

In step S16, the processing circuit 18 executes the estimation process of estimating the charge rate of the auxiliary battery 104 based on the voltage and temperature of the auxiliary battery 104 acquired in step S14. In general, it is known that the relationship between the battery voltage and the charge rate changes according to the charge and discharge current of the battery and the battery temperature. However, as shown in FIG. 3, a discharge current (so-called dark current) of the auxiliary battery 104 when the vehicle 100 is parked is, for example, 300 mA or less, which is sufficiently smaller than a discharge current when the vehicle 100 travels. Therefore, in the relationship between the voltage of the auxiliary battery 104 and the charge rate, an influence of the discharge current can be ignored. The graph A in FIG. 3 shows the relationship between the voltage and the charge rate when the discharge current of the auxiliary battery 104 is a first current value A1. The graph B in FIG. 3 shows the relationship between the voltage and the charge rate when the discharge current of the auxiliary battery 104 is a second current value A2. The first current value A1 is smaller than the second current value A2. For example, the first current value A1 is 30 mA, and the second current value A2 is 300 mA. For the graph A and the graph B in FIG. 3, the temperatures of the auxiliary battery 104 are equal to each other. From the above, in the process of step S16, the influence of the discharge current of the auxiliary battery 104 can be ignored.

Figure 4:
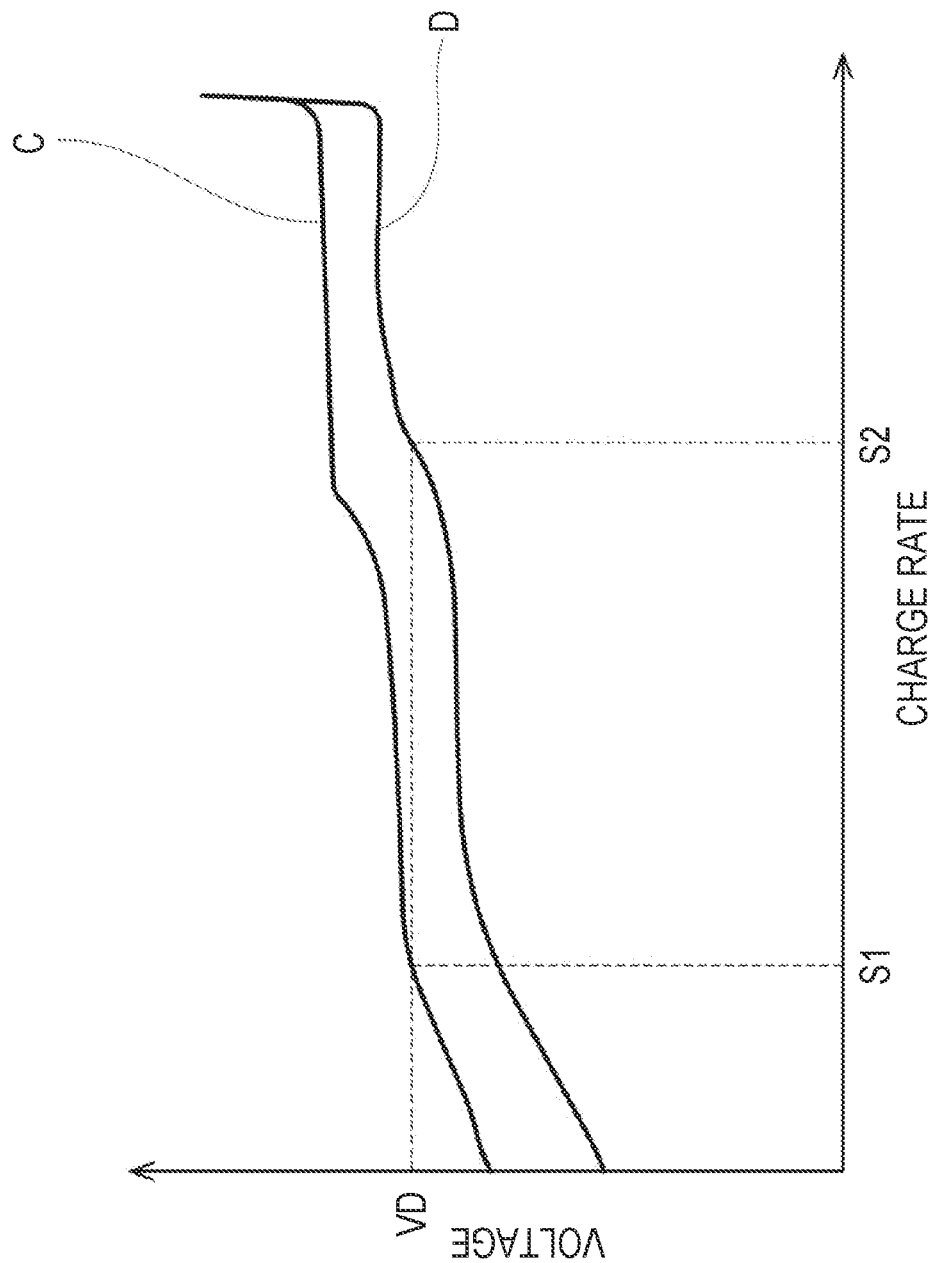
FIG. 4 is a graph showing an example of the relationship between the charge rate and the voltage of the auxiliary battery. Note that a graph C in FIG. 4 indicates a case where a temperature of the auxiliary battery is a first temperature, and a graph D in FIG. 4 indicates a case where the temperature of the auxiliary battery is a second temperature. The first temperature is higher than the second temperature.

On the other hand, as shown in FIG. 4, the relationship between the voltage of the auxiliary battery 104 and the charge rate changes according to the temperature of the auxiliary battery 104. The graph C in FIG. 4 shows the relationship between the charge rate and the voltage at a first temperature T1 of the auxiliary battery 104. The graph D in FIG. 4 shows the relationship between the charge rate and the voltage at a second temperature T2 of the auxiliary battery 104. The first temperature T1 is higher than the second temperature T2. For example, the first temperature T1 is 25 degrees, and the second temperature T2 is −25 degrees. For the graph C and the graph D in FIG. 4, the discharge currents of the auxiliary battery 104 are equal to each other. For example, when the voltage of the auxiliary battery 104 is a voltage VD, the charge rate is a first charge rate S1 when the temperature of the auxiliary battery 104 is the first temperature T1, and the charge rate is a second charge rate S2 when the temperature of the auxiliary battery 104 is the second temperature T2. The first charge rate S1 is significantly lower than the second charge rate S2. As described above, the relationship between the voltage of the auxiliary battery 104 and the charge rate changes according to the temperature of the auxiliary battery 104. Therefore, there is a need to consider an influence of the temperature of the auxiliary battery 104 in the process of step S16.

Based on the above, in step S16, the processing circuit 18 decides the relationship between the detection voltage and the charge rate according to the detection temperature and estimates the charge rate of the auxiliary battery 104 by using the decided relationship and the detection voltage. As an example, the processing circuit 18 can store in advance the relational equation describing the relationship between the detection voltage and the charge rate in association with various temperatures. The processing circuit 18 decides the relational equation describing the relationship between the charge rate and the voltage according to the detection temperature of the auxiliary battery 104 and estimates the charge rate from the detection voltage of the auxiliary battery 104 by using the decided relational equation. When the process of step S16 ends, the processing circuit 18 ends the series of processes.

As another embodiment, the processing circuit 18 may store in advance the map or table describing the relationship between the detection voltage and the charge rate in addition to or instead of the above relational equation in association with various temperatures. In this case, the processing circuit 18 may decide the map or table describing the relationship between the charge rate and the voltage according to the detection temperature of the auxiliary battery 104 and estimate the charge rate by using the map or table and the detection voltage of the auxiliary battery 104.

Figure 2:
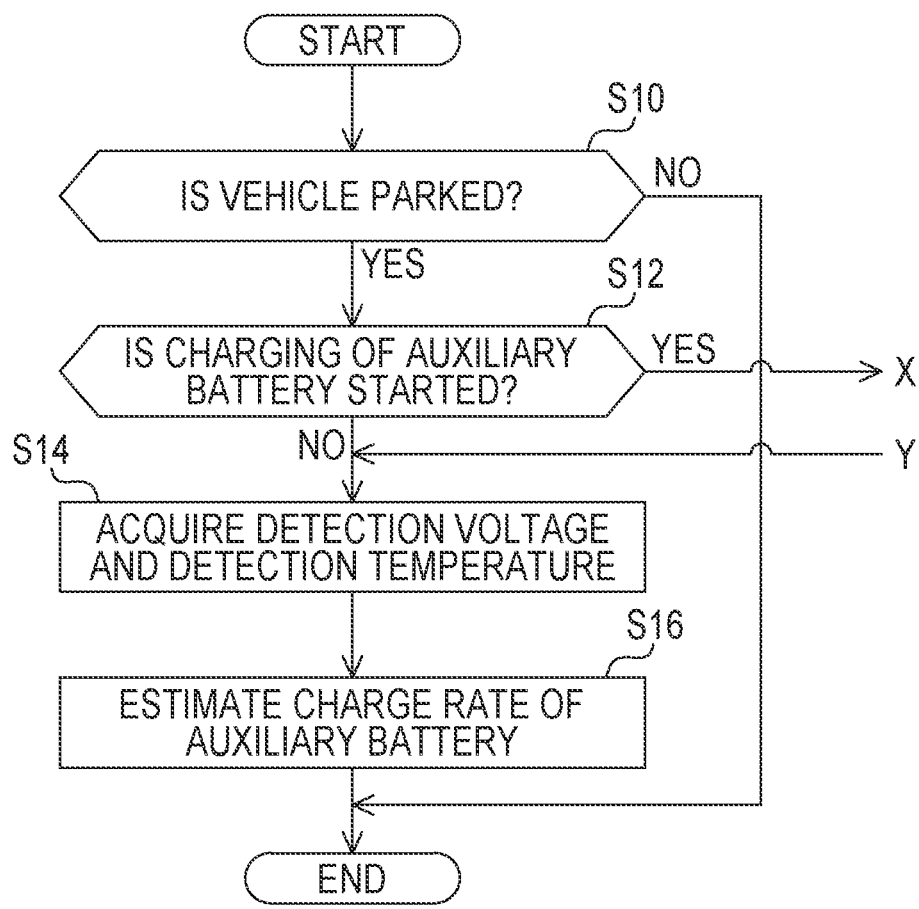
FIG. 2 is a flowchart showing a series of processes executed by a processing circuit together with FIG. 5. Here, X in FIG. 2 continues to X in FIG. 5, and Y in FIG. 5 continues to Y in FIG. 2.

Next, a process when YES is obtained in step S12 of FIG. 2, that is, when the charging of the auxiliary battery 104 is started while the vehicle 100 is parked will be described with reference to FIGS. 5 and 6. As described above, when YES is obtained in step S12 of FIG. 2, the processing circuit 18 proceeds to step S20 of FIG. 5. Accordingly, the estimation process in steps S14 and S16 of FIG. 2 is stopped while the auxiliary battery 104 is charged. As shown in FIG. 6, even when the vehicle 100 is parked, the detection voltage by the voltage sensor 12 depends on the charge voltage applied to the auxiliary battery 104 while the auxiliary battery 104 is charged (from point F to point G or from point I to point J in the figure). That is, the detection voltage by the voltage sensor 12 does not necessarily correspond to the charge rate of the auxiliary battery 104. For this reason, when the charging of the auxiliary battery 104 is started while the vehicle 100 is parked, the above estimation process is configured to be stopped. Accordingly, it is possible to avoid erroneously estimating the charge rate of the auxiliary battery 104 while the auxiliary battery 104 is charged.

In addition, when the charging of the auxiliary battery 104 ends (NO in step S22) and the predetermined condition is satisfied (YES in step S32), the processing circuit 18 returns to the process of step S14 of FIG. 2. Accordingly, the estimation process in steps S14 and S16 of FIG. 2 is configured to be stopped not only during the charging of the auxiliary battery 104 but also in the period immediately after the charging of the auxiliary battery ends. As shown in FIG. 6, even immediately after the charging of the auxiliary battery 104 ends (from point G to point H or from point J to point K in the figure), the influence of the charging remains temporarily on the voltage output by the auxiliary battery 104. During that time, the detection voltage by the voltage sensor 12 does not necessarily correspond to the charge rate of the auxiliary battery 104. For this reason, even after the charging of the auxiliary battery 104 ends, the above estimation process is configured to be stopped until the condition that the influence of the charging may be determined to be substantially eliminated is satisfied. Accordingly, it is possible to avoid erroneously estimating the charge rate of the auxiliary battery 104 immediately after the charging of the auxiliary battery 104 ends.

As described above, the estimation process in steps S14 and S16 of FIG. 2 is stopped during the charging of the auxiliary battery 104 and in the period immediately after the charging of the auxiliary battery ends. During that time, with the execution of the process shown in FIG. 5, the processing circuit 18 can specify a timing of returning to the process of step S14 of FIG. 2 and can simply estimate the charge rate of the auxiliary battery 104.

First, in step S20, the processing circuit 18 stores the detection voltage detected by the voltage sensor 12 and the detection temperature detected by the temperature sensor 16 at the start point in time of the charging. The processing circuit 18 estimates the charge rate of the auxiliary battery 104 by, for example, the same method as the process of step S16 of FIG. 2.

In step S22, the processing circuit 18 determines whether or not the auxiliary battery 104 is being charged. When the auxiliary battery 104 is being charged (YES in step S22), the processing circuit 18 calculates the charge amount due to the charging in step S24. For example, the processing circuit 18 integrates current values of the auxiliary battery 104 acquired by using the current sensor 14 to calculate the charge amount of the auxiliary battery 104. When the auxiliary battery 104 is not being charged (NO in step S22), the processing circuit 18 omits the process of step S24.

In step S26, the processing circuit 18 determines whether or not the auxiliary battery 104 is being discharged. When the auxiliary battery 104 is being discharged (YES in step S26), the processing circuit 18 calculates the discharge amount due to the discharging in step S28. In this case, the processing circuit 18 integrates, for example, detection currents by the current sensor 14 to calculate the discharge amount of the auxiliary battery 104, as in step S24. When the auxiliary battery 104 is not being discharged (NO in step S26), the processing circuit 18 omits the process of step S28.

In step S30, the processing circuit 18 simply estimates the charge rate of the auxiliary battery 104. As an example, the processing circuit 18 estimates the charge rate of the auxiliary battery 104 based on the charge rate at the start point in time of the charging of the auxiliary battery 104 (corresponding to points F and I in FIG. 6), the charge amount charged to the auxiliary battery 104 during the charging, and the discharge amount discharged from the auxiliary battery 104 after the charging. For example, the processing circuit 18 estimates the charge rate of the auxiliary battery 104 from the charge rate of the auxiliary battery 104 at the start point in time of the charging estimated in step S20 and a difference between the charge amount calculated in step S22 and the discharge amount calculated in step S26. The start point in time of the charging of the auxiliary battery 104 means a timing immediately before the charging of the auxiliary battery 104 is started and before the charge voltage is applied to the auxiliary battery 104.

Instead of the present embodiment, in step S30, the processing circuit 18 may estimate the charge rate of the auxiliary battery 104 based on the charge rate at the start point in time of the charging of the auxiliary battery 104, the charge amount charged to the auxiliary battery 104 during the charging, and the discharge amount of the auxiliary battery 104 estimated from the elapsed time after the charging. In this case, for example, the processing circuit 18 may store the discharge amount of the auxiliary battery 104 per day in advance and estimate the discharge amount discharged from the auxiliary battery 104 after the charging from the elapsed time after the charging to the auxiliary battery 104 ends. As described above, in step S30, the processing circuit 18 does not necessarily have to use the discharge amount calculated in step S28 as the discharge amount discharged from the auxiliary battery 104 after the charging. The discharge amount of the auxiliary battery 104 per day may be empirically set based on a use condition of the vehicle 100 or the like, or may be set according to a type of the auxiliary 106 mounted on the vehicle 100 or the like.

In step S32, the processing circuit 18 determines whether or not the discharge amount discharged from the auxiliary battery 104 after the charging reaches the charge amount charged to the auxiliary battery 104 during the charging. Specifically, the processing circuit 18 determines whether or not the discharge amount calculated in step S28 reaches the charge amount calculated in step S24. The processing circuit 18 returns to step S22 until the discharge amount calculated in step S28 reaches the charge amount calculated in step S24 (NO in step S32). When the discharge amount calculated in step S28 reaches the charge amount calculated in step S24 (YES in step S32), the processing circuit 18 returns to the process of step S14 of FIG. 2 via Y in FIG. 5. Here, "the discharge amount discharged from the auxiliary battery 104 after the charging reaches the charge amount charged to the auxiliary battery 104 during the charging" in the present embodiment is an example of the predetermined condition for restarting the estimation process in the present disclosure.

In the estimation device 10 described above, the estimation process (steps S14 and S16 in FIG. 2) of estimating the charge rate of the auxiliary battery 104 is executed while the vehicle 100 is parked. In the auxiliary battery 104 of the vehicle 100, the discharge current when the vehicle 100 is parked is sufficiently smaller than the discharge current when the vehicle 100 travels, and thus the influence of such a discharge current on the voltage of the auxiliary battery 104 can be ignored (refer to FIG. 3). On the other hand, the temperature of the auxiliary battery 104 changes variously due to the influence of the air temperature and the like even when the vehicle 100 is parked, and thus the influence of such a temperature change on the voltage of the auxiliary battery 104 cannot be ignored (refer to FIG. 4). For this reason, in the above estimation process, the charge rate of the auxiliary battery 104 is estimated based on the voltage and temperature of the auxiliary battery 104. As described above, the timing of estimating the charge rate of the auxiliary battery 104 is limited to the time when the vehicle 100 is parked, and the temperature of the auxiliary battery 104 is still taken into consideration. With the above, it is possible to accurately estimate the charge rate of the auxiliary battery 104 with a simple configuration.

The series of processes executed by the processing circuit 18 can be changed as appropriate. As an example thereof, a modification example of the series of processes executed by the processing circuit 18 will be described. In the present modification example, the processing circuit 18 of the estimation device 10 can execute the process shown in FIG. 7 instead of the process shown in FIG. 5. That is, when YES is obtained in step S12, the processing circuit 18 can proceed to step S40 in FIG. 7, instead of step S20 in FIG. 5, via X in FIG. 2. When YES is obtained in step S46 of FIG. 7, it is possible to return to the process of step S14 of FIG. 2 via Y in FIG. 7. For the same process as that described above of the processes shown in FIG. 7, the detailed description will be omitted by showing the corresponding step.

Figure 5:
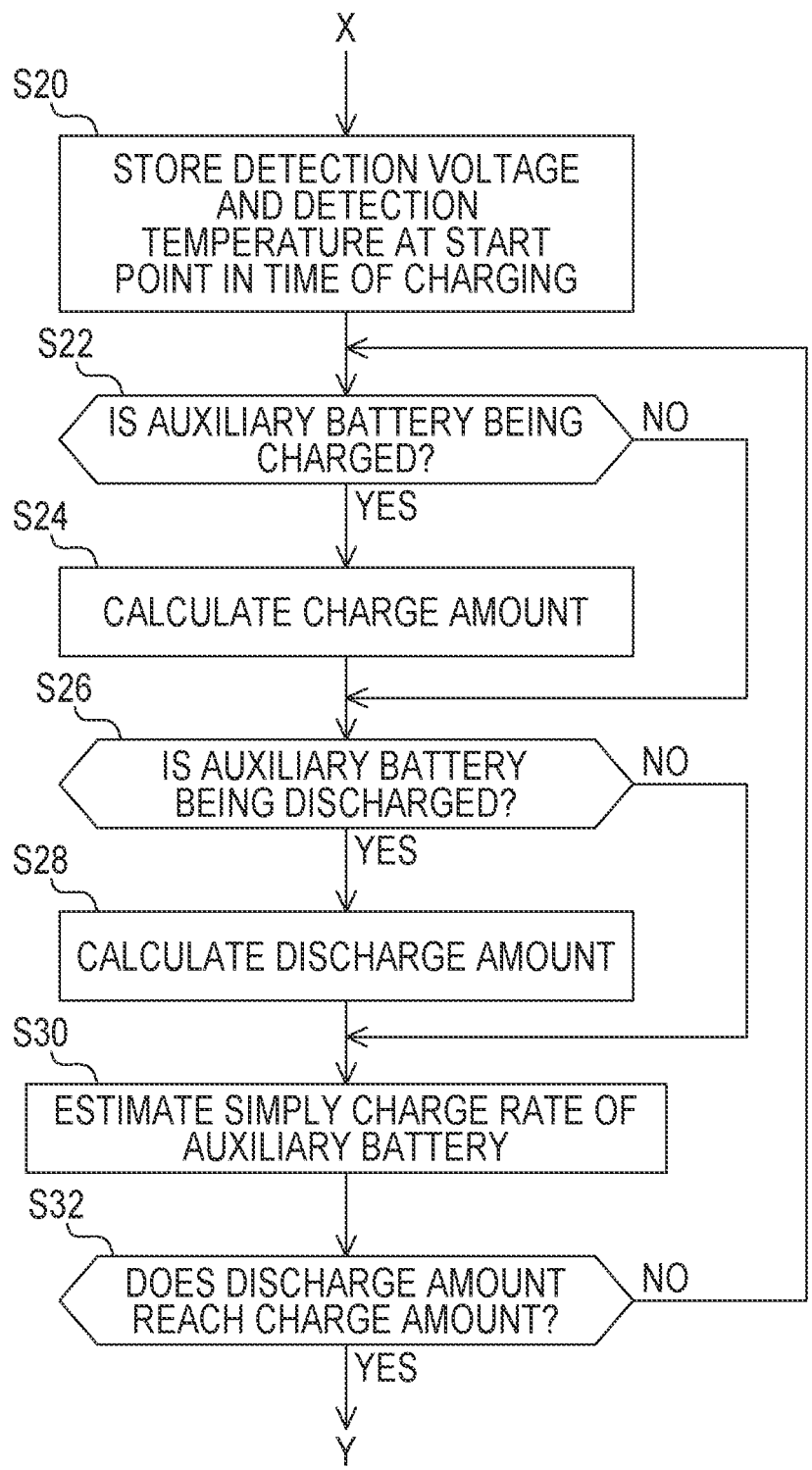
FIG. 5 is a flowchart showing the series of processes executed by the processing circuit together with FIG. 2. Here, X in FIG. 5 continues to X in FIG. 2, and Y in FIG. 5 continues to Y in FIG. 2.
Figure 6:
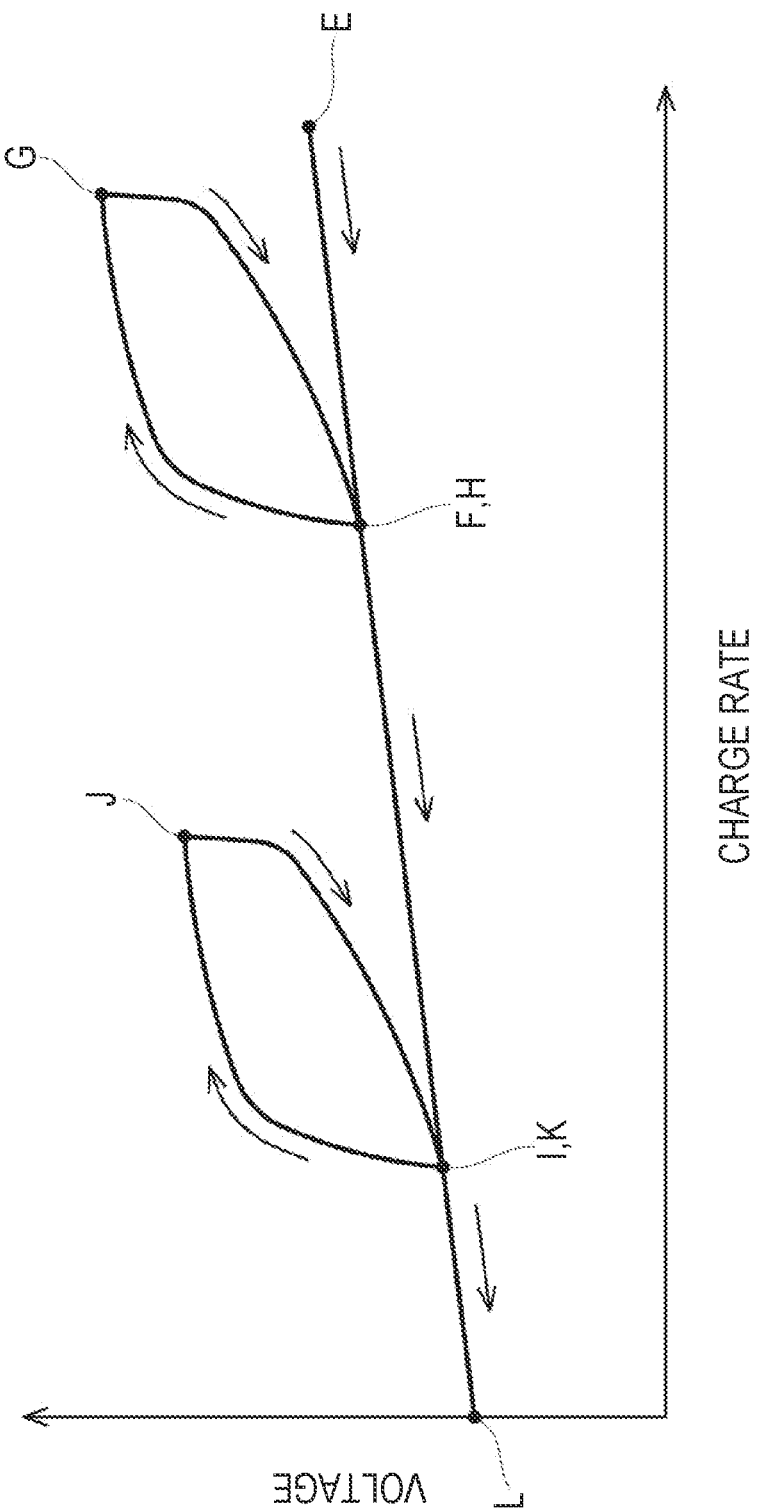
FIG. 6 is a graph showing an example of changes over time between the detection voltage of a voltage sensor and the charge rate of the auxiliary battery while the vehicle is parked. In the above example, the detection voltage and the charge rate change, starting from a point E in the figure, passing through points F, G, H, I, J, and K, and to a point L. A period from the point F to the point G and a period from the point I to the point J indicate periods during which the auxiliary battery is charged. A period from the point G to the point H and a period from the point J to the point K indicate periods immediately after the charging of the auxiliary battery ends.

In step S40, the processing circuit 18 stores the detection voltage and the detection temperature at the start point in time of the charging, as in step S20 of FIG. 5. In this case, although not particularly limited, the processing circuit 18 may estimate the charge rate of the auxiliary battery 104. In step S42, the processing circuit 18 acquires the detection voltage and the detection temperature, as in step S14 of FIG. 2. In step S44, the processing circuit 18 simply estimates the charge rate of the auxiliary battery 104, as in step S30 of FIG. 5. The process of step S42 is performed both during the charging of the auxiliary battery 104 and in the period immediately after the charging of the auxiliary battery ends. Therefore, the charge rate estimated in step S44 includes both the charge rate of the auxiliary battery 104 during the charging and the charge rate of the auxiliary battery 104 discharged after the charging ends.

As described above, the relationship between the voltage of the auxiliary battery 104 and the charge rate changes according to the temperature of the auxiliary battery 104. Therefore, when the temperature of the auxiliary battery 104 at the start point in time of the charging is different from a temperature of the auxiliary battery 104 after the end of the charging, the timing at which the charge rate after the end of the charging is equal to the charge rate at the start point in time of the charging may not be correctly specified by simply comparing detection voltages at respective points in time.

Regarding the above point, in step S46, the processing circuit 18 determines whether or not the charge rate estimated from the detection voltage and the detection temperature after the end of the charging is lowered to the charge rate estimated from the detection voltage and the detection temperature at the start point in time of the charging. For example, the processing circuit 18 estimates the charge rate from the detection voltage at the start point in time of the charging and calculates an estimation value of the charge rate after the end of the charging based on the detection temperature at the start point in time of the charging and the detection temperature after the end of the charging. When the detection voltage after the end of the charging is lowered to the estimation value (or voltage value corresponding to the estimation value) of the charge rate (YES in step S46), the processing circuit 18 returns to the process of step S14 in FIG. 2 via Y in FIG. 7. Here, "the charge rate estimated from the detection voltage and the detection temperature after the end of the charging is lowered to the charge rate estimated from the detection voltage and the detection temperature at the start point in time of the charging" in the present modification example is an example of the predetermined condition for restarting the estimation process in the present disclosure.

With such a configuration, even when the temperature of the auxiliary battery 104 at the start point in time of the charging is different from the temperature of the auxiliary battery 104 after the end of the charging, the timing at which the charge rate of the auxiliary battery 104 after the end of the charging is equal to the charge rate at the start point in time of the charging can be correctly specified. Accordingly, it is possible to stop the above estimation process until the charge rate of the auxiliary battery 104 returns to the charge rate before the charging and thus avoid erroneously estimating the charge rate of the auxiliary battery 104.

Figure 7:
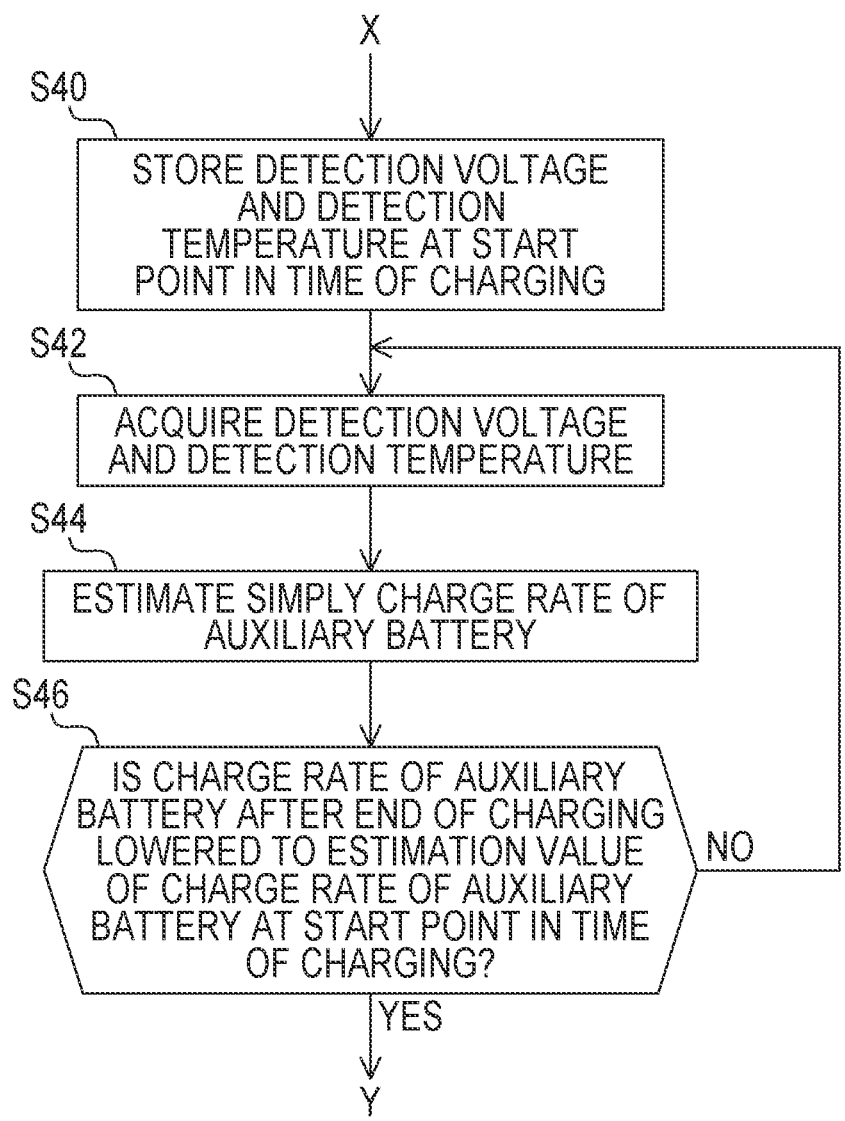
FIG. 7 is a flowchart showing a modification example of the series of processes executed by the processing circuit together with FIG. 2. Here, X in FIG. 7 continues to X in FIG. 2, and Y in FIG. 7 continues to Y in FIG. 2.

In another embodiment of the present disclosure, in the charging of the auxiliary battery 104, the charge current to the auxiliary battery 104 can be further limited as the detection temperature of the auxiliary battery 104 is lower. As an example, when the detection temperature at the start point in time of the charging stored in step S20 of FIG. 5 or step S40 of FIG. 7 is lower than a predetermined temperature lower limit value, the processing circuit 18 notifies the control device 110 of the fact (and the detection temperature). The control device 110 limits the charge current from the main battery 102 to the auxiliary battery 104 to be equal to or less than a predetermined value based on the notification from the processing circuit 18. The predetermined value referred to here can be changed as appropriate according to the temperature (that is, the detection temperature) of the auxiliary battery 104, the charge rate, and the like. With such a configuration, it is possible to suppress or substantially eliminate the influence of the charging of the auxiliary battery 104 on the auxiliary battery 104. Accordingly, it is possible to accurately estimate the charge rate of the auxiliary battery 104 even after the charging of the auxiliary battery 104.

Figure 8:
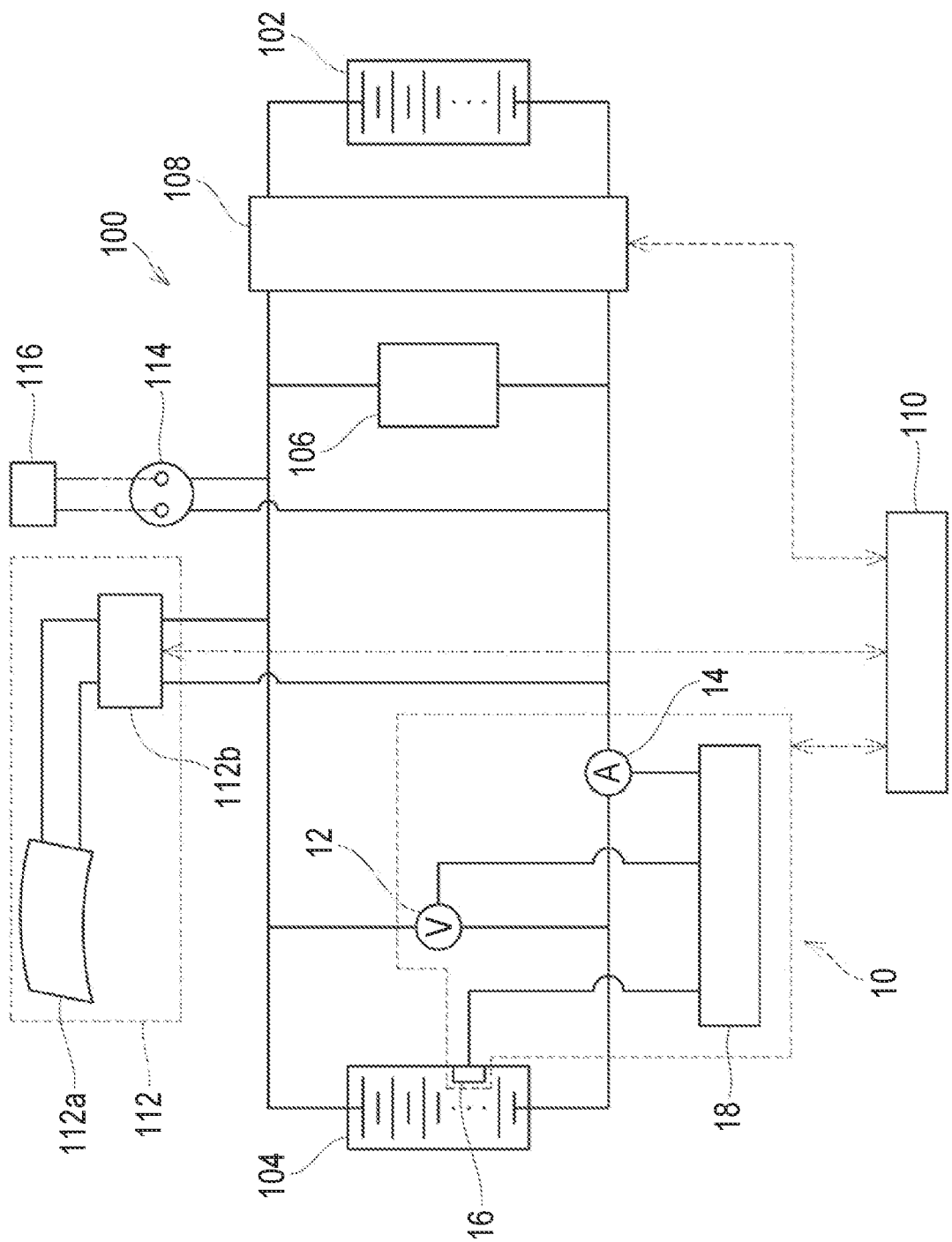
FIG. 8 is a schematic diagram showing a modification example of the vehicle configuration.

As shown in FIG. 8, the vehicle 100 of the embodiment may further include a solar charging system 112. The solar charging system 112 mainly includes a solar panel 112a and a DC-DC converter 112b. The solar panel 112a is a battery module which is an aggregate of solar battery cells that generate electricity by being irradiated with sunlight. The DC-DC converter 112b is a device that steps up or steps down input direct current electric power and outputs the stepped-up or stepped-down electric power. The solar panel 112a is electrically connected to the auxiliary battery 104 via the DC-DC converter 112b. The electric power generated by the solar panel 112a is stepped down by the DC-DC converter 112b and then supplied to the auxiliary battery 104. The operation of the DC-DC converter 112b is controlled by, for example, the control device 110. By controlling the operation of the DC-DC converter 112b, the control device 110 can start or stop the charging of the auxiliary battery 104 by the solar charging system 112.

Even when the vehicle 100 includes the solar charging system 112, the processing circuit 18 correctly estimates the charge rate of the auxiliary battery 104 by executing the series of processes shown in FIGS. 2 and 5 (or FIGS. 2 and 7). That is, even when the auxiliary battery 104 is charged by the solar charging system 112 instead of the main battery 102, the processing circuit 18 may stop the estimation process of steps S14 and S16 by making an affirmative determination in step S12 of FIG. 2 (YES in step S12). When the charging of the auxiliary battery 104 by the solar charging system 112 ends (NO in step S22 of FIG. 5) and a predetermined condition is satisfied (YES in step S32), the processing circuit 18 may return to the process of step S14 of FIG. 2. As described above, in the series of processes shown in FIGS. 2 and 5, the auxiliary battery 104 is charged not only by the main battery 102 but also by the solar charging system 112 mounted on the vehicle 100. Even in the charging by the solar charging system 112, it is possible to substantially ignore an influence of the charge current on the auxiliary battery 104 since the charge current of the auxiliary battery 104 when the vehicle 100 is parked is sufficiently small.

As shown in FIG. 8, the vehicle 100 of the embodiment may further include a charging port 114. In this case, the vehicle 100 does not necessarily have to include the solar charging system 112, but may include only the charging port 114. The charging port 114 is a component configured to electrically connect an external power supply 116 to the auxiliary battery 104. The charging port 114 is disposed at a random position on the vehicle 100 and is configured to be electrically connected to the auxiliary battery 104 and to be attached to and detached from the external power supply 116. With the electrical connection of the external power supply 116 to the charging port 114, the charging of the auxiliary battery 104 by the external power supply 116 is started. When the external power supply 116 is removed from the charging port 114, the charging of the auxiliary battery 104 by the external power supply 116 is stopped. Although not particularly limited, when a rated voltage of the external power supply 116 is different from the rated voltage of the auxiliary battery 104, a DC-DC converter may be further provided between the charging port 114 and the auxiliary battery 104. The external power supply 116 is not limited to a direct current power supply, but may be an alternating current power supply. In this case, an AC-DC converter may be further provided between the charging port 114 and the auxiliary battery 104.

Even when the vehicle 100 includes the charging port 114, the processing circuit 18 can correctly estimate the charge rate of the auxiliary battery 104 by executing the series of processes shown in FIGS. 2 and 5 (or FIGS. 2 and 7). That is, even when the auxiliary battery 104 is charged by the external power supply 116, the processing circuit 18 may stop the estimation process of steps S14 and S16 by making an affirmative determination in step S12 of FIG. 2 (YES in step S12). When the charging of the auxiliary battery 104 by the external power supply 116 ends (NO in step S22 of FIG. 5) and the predetermined condition is satisfied (YES in step S32), the processing circuit 18 returns to the process of step S14 of FIG. 2. As described above, in the series of processes shown in FIGS. 2 and 5, the auxiliary battery 104 is charged not only by the main battery 102 and the solar charging system 112, but also by the external power supply 116. Even in the charging by the external power supply 116, it is possible to substantially ignore an influence of the charge current on the auxiliary battery 104 when the charge current of the auxiliary battery 104 when the vehicle 100 is parked is sufficiently small.

The vehicle 100 in the present embodiment is, for example, a hybrid electric vehicle, a fuel cell electric vehicle, a battery electric vehicle, a solar car, or the like. However, as another embodiment, the vehicle 100 may be an engine vehicle. In this case, the vehicle 100 may further include a generator that generates electricity by power of an engine, such as an alternator. The generator is electrically connected to the auxiliary battery 104 and the auxiliary 106 and may be configured to supply the electric power generated by the power of the engine to the auxiliary battery 104 and the auxiliary 106.

Although specific examples of the present disclosure have been described in detail above, the specific examples are merely examples and do not limit the scope of claims. The techniques described in the claims include various modifications and changes of the specific examples exemplified above. The technical elements described in the present specification or the drawings exhibit their technical usefulness alone or in combination.

What is claimed is:

1. An estimation device configured to estimate a charge rate of a battery, the battery being configured to supply electric power to an auxiliary mounted on a vehicle, the estimation device comprising:
    a voltage sensor configured to detect a voltage of the battery;
    a temperature sensor configured to detect a temperature of the battery; and
    a processing circuit connected to the voltage sensor and the temperature sensor and configured to execute, while the vehicle is parked, an estimation process of estimating the charge rate of the battery based on a detection voltage and a detection temperature, the detection voltage being detected by the voltage sensor, the detection temperature being detected by the temperature sensor,
    wherein the processing circuit is configured to stop the estimation process when charging of the battery is started while the vehicle is parked, and
    wherein the processing circuit is configured to estimate, while the estimation process is stopped, the charge rate of the battery based on the charge rate at a start point in time of the charging, a charge amount charged to the battery during the charging, and a discharge amount discharged from the battery after the charging.

2. The estimation device according to claim 1, wherein the estimation process is a process of deciding a relationship between the detection voltage and the charge rate according to the detection temperature and estimating the charge rate by using the decided relationship and the detection voltage.

3. The estimation device according to claim 1, wherein the processing circuit is configured to restart the estimation process when the charging of the battery ends and then a predetermined condition is satisfied.

4. The estimation device according to claim 3, wherein the predetermined condition includes a condition where a discharge amount discharged from the battery after the charging reaches a charge amount charged to the battery during the charging.

5. The estimation device according to claim 3, wherein the processing circuit is configured to store the detection voltage and the detection temperature at a start point in time of the charging, and the predetermined condition includes a condition where a charge rate estimated from the detection voltage and the detection temperature after the end of the charging is lowered to a charge rate estimated from the detection voltage and the detection temperature at the start point in time of the charging.

6. The estimation device according to claim 1, wherein a charge current to the battery is further limited as the detection temperature of the battery is lower, during the charging of the battery.

7. The estimation device according to claim 1, wherein the charging of the battery is performed by a solar charging system mounted on the vehicle.

8. The estimation device according to claim 1, wherein the charging of the battery is performed by an external power supply connected to the vehicle.

9. An estimation device configured to estimate a charge rate of a battery, the battery being configured to supply electric power to an auxiliary mounted on a vehicle, the estimation device comprising:
    a voltage sensor configured to detect a voltage of the battery;
    a temperature sensor configured to detect a temperature of the battery; and
    a processing circuit connected to the voltage sensor and the temperature sensor and configured to execute, while the vehicle is parked, an estimation process of estimating the charge rate of the battery based on a detection voltage and a detection temperature, the detection voltage being detected by the voltage sensor, the detection temperature being detected by the temperature sensor,
    wherein the processing circuit is configured to stop the estimation process when charging of the battery is started while the vehicle is parked, and
    wherein the processing circuit is configured to estimate, while the estimation process is stopped, the charge rate of the battery based on the charge rate at a start point in time of the charging, a charge amount charged to the battery during the charging, and a discharge amount of the battery estimated from an elapsed time after the charging.

* * * * *